United States Patent
Park et al.

(10) Patent No.: US 10,896,870 B2
(45) Date of Patent: Jan. 19, 2021

(54) SEMICONDUCTOR DEVICE WITH AIR GAPS IN INTERLAYER INSULATING LAYER AND METHOD OF MANUFACTURING THE SAME

(71) Applicant: Samsung Electronics Co., Ltd., Suwon-si (KR)

(72) Inventors: Jae Hong Park, Hwaseong-si (KR); Woo Jin Lee, Hwaseong-si (KR)

(73) Assignee: SAMSUNG ELECTRONICS CO., LTD., Gyeonggi-do (KR)

(*) Notice: Subject to any disclaimer, the term of this patent is extended or adjusted under 35 U.S.C. 154(b) by 35 days.

(21) Appl. No.: 16/181,739

(22) Filed: Nov. 6, 2018

(65) Prior Publication Data

US 2019/0304895 A1 Oct. 3, 2019

(30) Foreign Application Priority Data

Mar. 30, 2018 (KR) .................. 10-2018-0037092

(51) Int. Cl.
*H01L 21/768* (2006.01)
*H01L 23/522* (2006.01)
*H01L 21/311* (2006.01)
*H01L 23/532* (2006.01)

(52) U.S. Cl.
CPC .... *H01L 23/5222* (2013.01); *H01L 21/31111* (2013.01); *H01L 21/31144* (2013.01); *H01L 21/7682* (2013.01); *H01L 21/76807* (2013.01); *H01L 21/76831* (2013.01); *H01L 23/5329* (2013.01)

(58) Field of Classification Search
CPC .................................................. H01L 21/7682
See application file for complete search history.

(56) References Cited

U.S. PATENT DOCUMENTS

| 7,754,601 | B2 | 7/2010 | Chen et al. | |
|---|---|---|---|---|
| 7,943,480 | B2 * | 5/2011 | Edelstein | .......... H01L 21/31144 438/421 |
| 8,241,991 | B2 | 8/2012 | Hsieh et al. | |
| 8,629,560 | B2 * | 1/2014 | Liu | ................... H01L 21/76807 257/758 |

(Continued)

FOREIGN PATENT DOCUMENTS

JP          2014-183135 A      9/2014

*Primary Examiner* — Daniel Luke
(74) *Attorney, Agent, or Firm* — Muir Patent Law, PLLC

(57) ABSTRACT

A semiconductor device includes an interlayer insulating layer disposed on a substrate, a first metal wiring and a second metal wiring disposed in the interlayer insulating layer, the first and second wirings spaced apart from each other in a first direction, the first and second wirings extending to a second direction perpendicular to the first direction, an air gap formed in the interlayer insulating layer between the first metal wiring and the second metal wiring, and spaced apart from a sidewall of the first metal wiring and a sidewall of the second metal wiring, and a capping layer disposed on the interlayer insulating layer, the capping layer covering the first metal wiring, the second metal wiring, and the air gap, wherein the air gap is disposed at a first distance from the first metal wiring in the first direction and at a second distance from the second metal wiring in the first direction, and wherein the first and second distances are the same.

15 Claims, 16 Drawing Sheets

(56) References Cited

U.S. PATENT DOCUMENTS

| | | |
|---|---|---|
| 9,312,220 B2 * | 4/2016 | Lu .................... H01L 23/5329 |
| 9,721,891 B2 | 8/2017 | Xu et al. |
| 9,768,118 B1 | 9/2017 | Li et al. |
| 9,786,553 B1 | 10/2017 | Yang |
| 9,799,553 B2 | 10/2017 | Tung |
| 2006/0030128 A1 | 2/2006 | Bu et al. |
| 2011/0076831 A1 | 3/2011 | Chen |
| 2016/0163581 A1 * | 6/2016 | Yoshida ............ H01L 21/7682 257/773 |
| 2016/0181144 A1 | 6/2016 | Nitta et al. |
| 2017/0263553 A1 | 9/2017 | Schenker et al. |

\* cited by examiner

SEMICONDUCTOR DEVICE WITH AIR GAPS IN INTERLAYER INSULATING LAYER AND METHOD OF MANUFACTURING THE SAME

CROSS-REFERENCE TO RELATED APPLICATION(S)

This application claims priority under 35 U.S.C. § 119 to Korean Patent Application No. 10-2018-0037092 filed on Mar. 30, 2018 in the Korean Intellectual Property Office, the disclosure of which is incorporated by reference herein in its entirety.

BACKGROUND

1. Field

The present inventive concept relates to a semiconductor device.

2. Description of Related Art

As the demand for high performance, high speed, and/or multifunctionality of a semiconductor device is increased, a degree of integration of a semiconductor device is increasing. It is necessary to implement wirings, included in a semiconductor device, to have a fine width and/or a fine interval in accordance with the trend for high levels of integration in semiconductor devices. Therefore, efforts are being made to reduce parasitic capacitance between wirings.

SUMMARY

Example embodiments of the present inventive concept may provide a semiconductor device with reduced RC delay.

Example embodiments of the present inventive concept may provide a method for manufacturing a semiconductor device in which air gaps are formed between metal wirings without damage to a metal wiring.

According to an example embodiments of the present inventive concept, a semiconductor device includes: an interlayer insulating layer disposed on a substrate; a first metal wiring and a second metal wiring disposed in the interlayer insulating layer, the first and second wirings spaced apart in a first direction, the first and second wirings extending to a second direction perpendicular to the first direction; an air gap formed in the interlayer insulating layer between the first metal wiring and the second metal wiring, and spaced apart from a sidewall of the first metal wiring and a sidewall of the second metal wiring; and a capping layer disposed on the interlayer insulating layer, the capping layer covering the first metal wiring, the second metal wiring, and the air gap, wherein the air gap is disposed at a first distance from the first metal wiring in the first direction and at a second distance from the second metal wiring in the first direction, and wherein the first and second distances are the same.

According to an example embodiments of the present inventive concept, a semiconductor device includes: an interlayer insulating layer disposed on a substrate; a first metal wiring and a second metal wiring disposed in the interlayer insulating layer, the first and second wirings spaced apart from each other in a first direction, the first and second wirings extending to a second direction perpendicular to the first direction; a first air gap formed on a sidewall of the first metal wiring, the first air gap extending to the second direction; a second air gap formed on a sidewall of the second metal wiring, the second air gap extending to the second direction; a third air gap formed between the first air gap and the second air gap, the third air gap extending to the second direction; and a capping layer covering the first air gap, the second air gap, and the third air gap, wherein the first and second wirings are immediately adjacent to each other in the first direction.

According to an example embodiments of the present inventive concept, a semiconductor device includes: an interlayer insulating layer on a substrate; metal wirings disposed in the interlayer insulating layer, the metal wirings spaced apart in a first direction, the metal wirings extending to a second direction perpendicular to the first direction; sidewall air gaps each disposed on a sidewall of corresponding one of the metal wirings; intermediate air gaps each disposed in the interlayer insulating layer and between a corresponding pair of the sidewall air gaps; and a capping layer covering the sidewall air gaps and the intermediate air gaps, wherein, with respect to the first direction, each of the intermediate air gaps is disposed between a corresponding pair of immediately adjacent metal wirings and spaced apart from each of the corresponding pair of immediately adjacent metal wirings, wherein a width of the sidewall air gaps in the first direction is different from a width of the intermediate air gaps in the first direction, wherein the first direction is parallel to a surface of the substrate.

BRIEF DESCRIPTION OF DRAWINGS

The above and other aspects, features and other advantages of the present inventive concept will be more clearly understood from the following detailed description, taken in conjunction with the accompanying drawings, in which.

DETAILED DESCRIPTION

Hereinafter, example embodiments of the present inventive concept will be described in detail with reference to the accompanying drawings.

Figure 1:
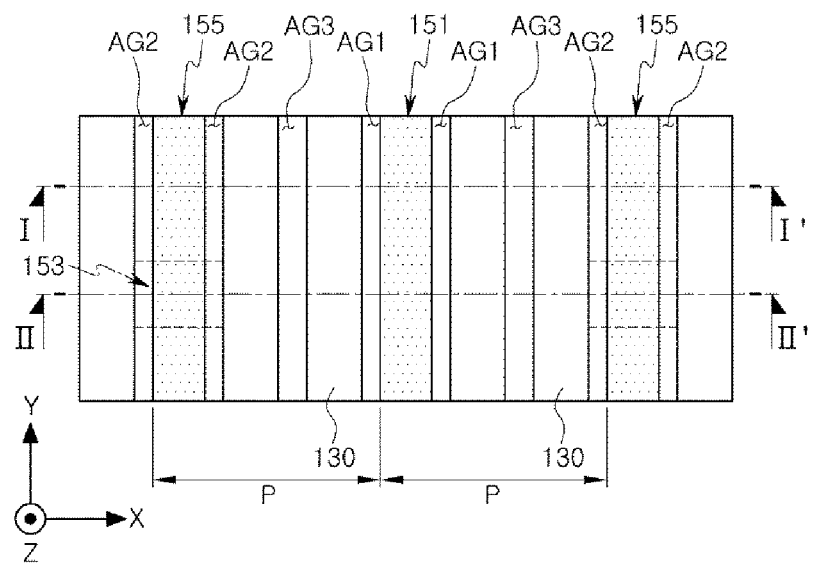
FIG. 1 is a plan view illustrating a semiconductor device according to an example embodiment.
Figure 2A:
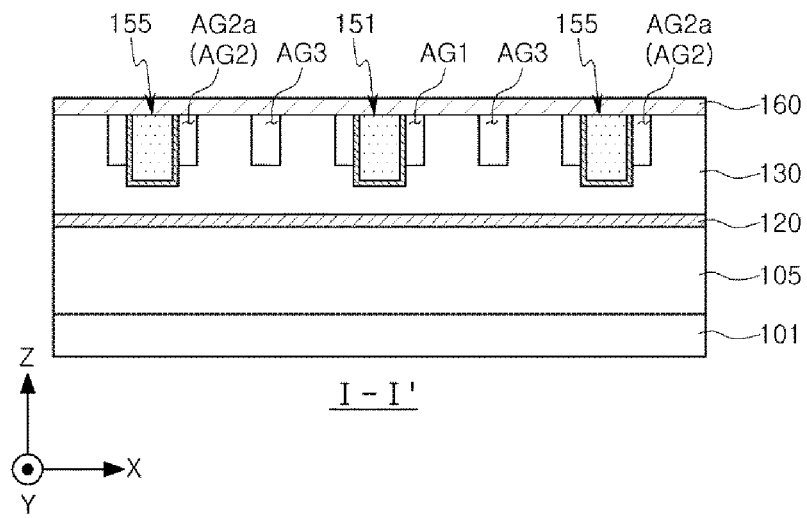
FIGS. 2A and 2B are cross-sectional views respectively taken along lines I-I' and II-II' of the semiconductor device illustrated in FIG. 1.
Figure 2B:
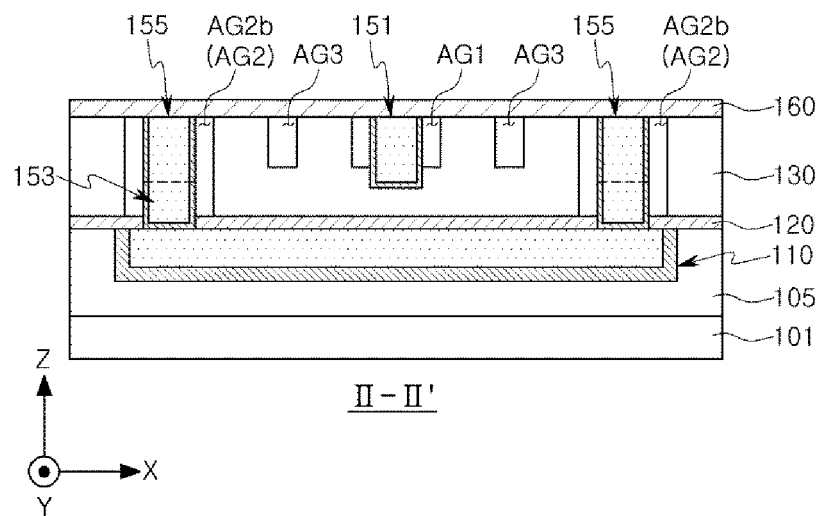

FIG. 1 is a plan view illustrating a semiconductor device according to an example embodiment. FIG. 2A is a cross-sectional view of a semiconductor device according to an example embodiment, and is a cross section taken along line I-I' of FIG. 1. FIG. 2B is a cross-sectional view of a semiconductor device according to an example embodiment, and is a cross section taken along line II-II' of FIG. 1.

Referring to FIGS. 1, 2A, and 2B, the semiconductor device may include a substrate 101, a first interlayer insulating layer 105, a lower wiring 110, an etch stop layer 120, a second interlayer insulating layer 130, a first metal wiring 151, a second metal wiring 155, a conductive via 153, a first air gap AG1, a second air gap AG2, a third air gap AG3, and a capping layer 160. The first to third air gaps AG1, AG2 and AG3, and other air gaps in this disclosure will be understood to comprise gaps filled with air or other gases, or gaps having a gasless vacuum state. The second metal wiring 155 and the conductive via 153 may form a dual damascene structure. For example, the metal wirings 155 and the conductive via 153 may be formed by an identical process. For example, a dual depth structure of trench and via hole may be formed in the second interlayer insulating layer 130, and a metal layer (or a conductive layer) may be filled in the dual depth structure of trench and via hole to form the conductive via 153 and the second wiring 155 at the same time. In certain embodiments, a diffusion barrier layer may be formed between the second interlayer insulating layer 130 and the metal layer (or a conductive layer).

The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may be provided as a semiconductor wafer, a Silicon-On-Insulator (SOI) wafer, or the like.

The first interlayer insulating layer 105 may be disposed on the substrate 101. The lower wiring 110 may be disposed in the first interlayer insulating layer 105. For example, at least a portion of the lower wiring 110 may be disposed at a lower level than a top surface of the first insulating layer 105 and at an upper level than a lower surface of the first insulating layer 105 in a cross-sectional view. The first interlayer insulating layer 105 may be formed of silicon oxide or a low-k insulating material having a dielectric constant lower than that of the silicon oxide. Transistors forming an integrated circuit may be disposed on the substrate 101.

The etch stop layer 120 may be disposed on the first interlayer insulating layer 105 and the lower wiring 110. The etch stop layer 120 may contain a silicon-containing material, for example, silicon nitride (SiN), silicon oxynitride (SiON), silicon carbide (SiC), silicon carbonitride (SiCN), or the like. The etch stop layer 120 may contain a metal-containing material such as metal nitride, metal oxide, or the like.

The second interlayer insulating layer 130 may be disposed on the etch stop layer 120. The metal wirings 151 and 155 may be disposed in the second interlayer insulating layer 130. For example, the metal wirings 151 and 155 may be disposed at constant intervals, while having a constant width in a first direction (e.g., X direction). For example, the metal wirings 151 and 155 may be disposed at a constant pitch, for example, in the first direction (X direction). The pitch is the sum of a width of a pattern of the wirings 151 and 155 and an interval between immediately adjacent two patterns of the wirings 151 and 155.

The first metal wiring 151 and the second metal wiring 155 may extend, for example, in a second direction (e.g., Y direction). For example, X and Y directions are perpendicular to each other and parallel to the surface of the substrate 101.

The first air gap AG1 is disposed on a sidewall of the first metal wiring 151, and the second air gap AG2 may be disposed on a sidewall of the second metal wiring 155. The first air gap AG1 may be referred to as a first sidewall air gap, and the second air gap AG2 may be referred to as a second sidewall air gap. For example, the first sidewall air gap may be formed between the first metal wiring 151 and the second interlayer insulating layer 130 in a horizontal direction and the second sidewall air gap may be formed between the second metal wiring 155 and the second interlayer insulating layer 130 in the horizontal direction. For example, each of the first and second wirings 151 and 155 may comprise a boundary of corresponding one of the first and second air gaps AG1 and AG2. The third air gap AG3 may be disposed in the second interlayer insulating layer 130 between the first air gap AG1 and the second air gap AG2 in the horizontal direction. The third air gap AG3 may be disposed in the second interlayer insulating layer 130 between the first metal wiring 151 and the second metal wiring 155. The third air gap AG3 may be referred to as an intermediate air gap. The third air gap AG3 is spaced apart from a sidewall of the first metal wiring 151 and a sidewall of the second metal wiring 155, and a first distance spaced apart from the first metal wiring 151 may be equal to a second distance spaced apart from the second metal wiring 155. For example, the third air gap AG3 may be formed between a pair of immediately adjacent first and second metal wirings 151 and 155. For example, the third air gap AG3 may be formed between immediately adjacent sidewall air gaps respectively formed on the first and second metal wirings 151 and 155. For example, the third air gap AG3 may be disposed between adjacent first and second metal wirings 151 and 155 without any wiring between the adjacent first and second metal wirings 151 and 155 in a cross-sectional view. For example, each of intermediate air gaps may be formed between a corresponding pair of immediately adjacent metal wirings 151 and 155. For example, each of the intermediate air gaps may be disposed between a corresponding pair of sidewall air gaps respectively formed on corresponding metal wirings.

A width of the second air gap AG2 is equal to a width of the first air gap AG1, and a width of the third air gap AG3 may be different from the width of the first air gap AG1. The width of the third air gap AG3 may be greater than the width of the first air gap AG1. In an example embodiment, the width of the third air gap AG3 may be smaller than the width of the first air gap AG1. Here, the width of the air gap refers to a size of the air gap in the first direction (X direction).

The first air gap AG1, the second air gap AG2, and the third air gap AG3 may continuously extend in the second direction (Y direction), in which the first metal wiring 151 and the second metal wiring 155 extend. For example, the first air gap AG1 may extend alongside with the first metal wiring 151 in the second direction, and the second air gap AG2 may extend alongside with the second metal wiring 155 in the second direction.

The capping layer 160 is integrally formed over the entirety of the substrate 101, and may cover the first and second metal wirings 151 and 155, as well as the first to third air gaps AG1, AG2, and AG3. The capping layer 160 may be disposed on the second interlayer insulating layer 130 while sealing an upper portion of the first to third air gaps AG1, AG2, and AG3. The capping layer 160 may be formed using a non-conformal deposition method. For example, the capping layer 160 may contact the second interlayer insulating layer 130 and may not contact bottom surfaces of the first to third air gaps AG1, AG2 and AG3. In certain embodiments, the capping layer 160 may have a top surface morphology different from the morphology of the bottom surface contacting the second interlayer insulating layer 130 and the first and second metal wirings 151 and 155. For example, the non-conformal deposition method may comprise angled physical vapor deposition. The capping layer 160 may contain a silicon-containing material, for example, SiN, SiON, SiC, SiCN, or the like. The capping layer 160 may contain a metal-containing material such as metal nitride, metal oxide, or the like.

A distance from a first portion of a lower surface of the capping layer 160 to a bottom of the first air gap AG1 may be less than a distance from a second portion of the lower surface of the capping layer 160 to a bottom of the first metal wiring 151. A distance from a third portion of the lower surface of the capping layer 160 to a bottom of a third air gap AG3 may be less than the distance from the second portion of the lower surface of the capping layer 160 to the bottom of the first metal wiring 151. The distance from the third portion of the lower surface of the capping layer 160 to the bottom of a third air gap AG3 may be equal to the distance from the first portion of the lower surface of the capping layer 160 to the bottom of the first air gap AG1. The distance from the first portion of the lower surface of the capping layer 160 to the bottom of the first air gap AG1 may be a height of the first air gap AG1, while the distance from the third portion of the lower surface of the capping layer 160 to the bottom of the third air gap AG3 may be a height of the third air gap AG3. The distance from the second portion of the lower surface of the capping layer 160 to the bottom of the first metal wiring 151 may be a height of the first metal wiring 151. The height of the first air gap AG1 and the height of the second air gap AG2 may be smaller than the height of the first metal wiring 151, and the height of the third air gap AG3 may be equal to the height of the first air gap AG1. The height of the air gap refers to a size of the air gap (e.g., a distance between two end points) in a third direction (a Z direction, e.g., a perpendicular direction to the surface of the substrate 101).

A thickness of the first interlayer insulating layer 130 located below the first air gap AG1 may be greater than a thickness of the first interlayer insulating layer 130 located below the first metal wiring 151. A thickness of the first interlayer insulating layer 130 located below the third air gap AG3 may be greater than the thickness of the first interlayer insulating layer 130 located below the first metal wiring 151. A thickness of the first interlayer insulating layer 130 located below the third air gap AG3 may be equal to the thickness of the first interlayer insulating layer 130 located below the first air gap AG1.

The conductive via 153, extending from the second metal wiring 155 toward the substrate 101, passes through the second interlayer insulating layer 130 and the etch stop layer 120 to be connected to the lower wiring 110. In an example embodiment, the second metal wiring 155 and the conductive via 153 may have a dual damascene structure, integrally formed.

The second air gap AG2, disposed on a sidewall of the second metal wiring 155, may include portions having different distances, from a lower surface of the capping layer 160 to a bottom of the second air gap AG2. For example, the second air gap AG2 includes portions having different heights. The second air gap AG2 may include a first portion AG2a having a height equal to a height of the first air gap AG1 and a second portion AG2b disposed on a sidewall of the conductive via 153 and on a sidewall of the second metal wiring 155 disposed on the conductive via 153. The second portion AG2b may have a height greater than a height of the first air gap AG1. The height of the second portion AG2b of the second air gap AG2 may be equal to the thickness of the second interlayer insulating layer 130.

According to an example embodiment, the semiconductor device may include the first air gap AG1, the second air gap AG2, and the third air gap AG3, self-aligned between metal wirings 151 and 155. For example, the air gaps AG1, AG2 and AG3 may be formed by a multi-pattering technology, e.g., a self-aligned double patterning process or a self-aligned quadruple patterning process in which spacers on mandrel patterns and subsequent patterns are aligned with predetermined distances with each other by thicknesses of spacers. For example, the air gaps AG1, AG2 and/or AG3 may be formed by using a sacrificial spacer formed on a sidewall of a pattern/trench. The resulting air gaps AG1, AG2 and AG3 may be self-aligned with the metal wirings 151 and 155, e.g., contact and/or with predetermined distances. For example, the third air gap AG3 may be aligned, with the multi-pattering mechanism, to be disposed at a center between the first metal wiring 151 and the second metal wiring 155 in a cross-sectional view as will be described below in detail. By the first air gap AG1, the second air gap AG2, and the third air gap AG3, parasitic capacitance between the metal wirings 151 and 155 may be reduced. Thus, resistance-capacitance (RC) delay may be reduced and an operating speed of the semiconductor device may be improved.

Figure 3:
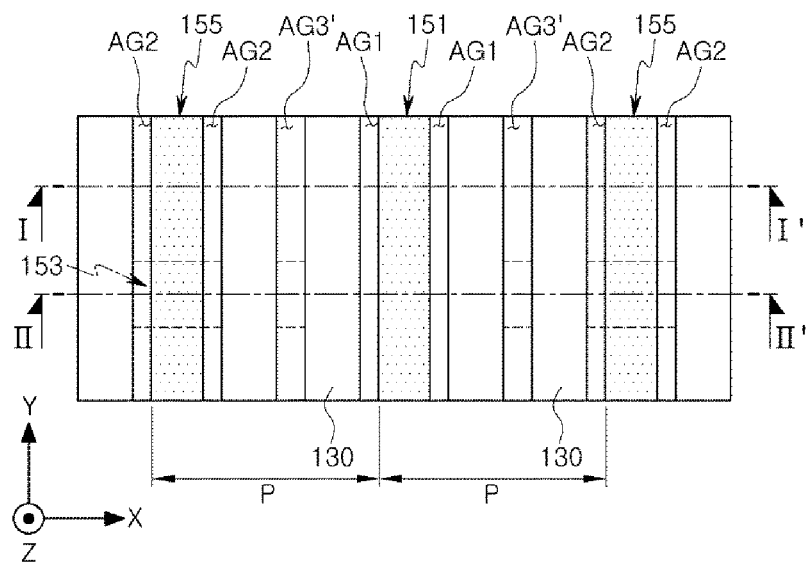
FIG. 3 is a plan view illustrating a semiconductor device according to an example embodiment.
Figure 4A:
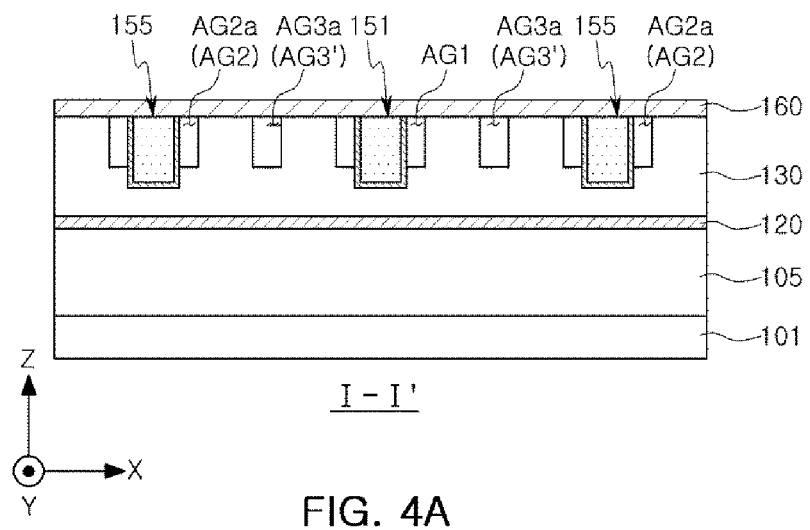
FIGS. 4A and 4B are cross-sectional views respectively taken along lines I-I' and II-II' of the semiconductor device illustrated in FIG. 3.
Figure 4B:
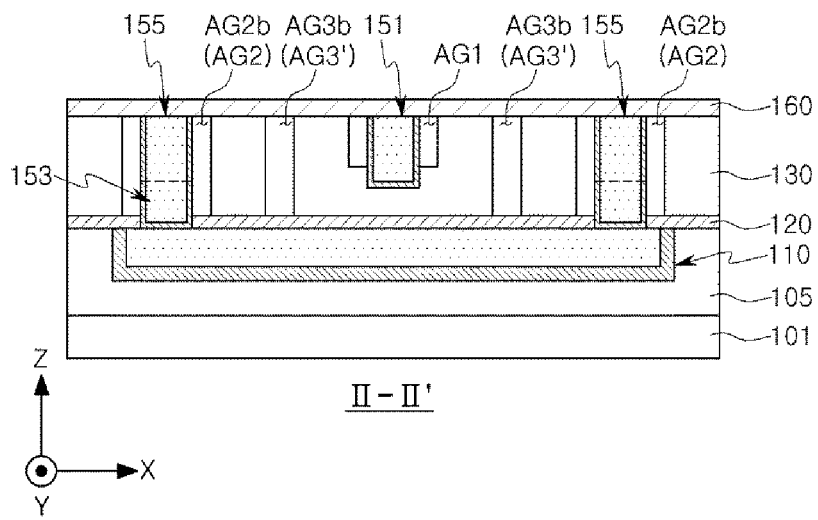

FIG. 3 is a plan view illustrating a semiconductor device according to an example embodiment. FIG. 4A is a cross-sectional view of a semiconductor device according to an example embodiment, and is a cross section taken along line I-I' of FIG. 3. FIG. 4B is a cross-sectional view of a semiconductor device according to an example embodiment, and is a cross section taken along line II-II' of FIG. 3. Hereinafter, a description overlapping with the description of FIGS. 1, 2A, and 2B will be omitted.

Referring to FIGS. 3, 4A, and 4B, the semiconductor device may include a substrate 101, a first interlayer insulating layer 105, a lower wiring 110, an etch stop layer 120, a second interlayer insulating layer 130, a first metal wiring 151, a second metal wiring 155, a conductive via 153, a first air gap AG1, a second air gap AG2, a third air gap AG3', and a capping layer 160. The second metal wiring 155 and the conductive via 153 may form a dual damascene structure.

The third air gap AG3' may include portions having different heights, in a manner similar to the second air gap AG2. The third air gap AG3' may include a first portion AG3a having a height equal to a height of the first air gap AG1 and a second portion AG3b adjacent to a sidewall of the conductive via 153 and having a height greater than a height of the first air gap AG1. The height of the second portion AG3b of the third air gap AG3' may be equal to the thickness of the second interlayer insulating layer 130. For example, the second portion AG3b of the third air gap AG3' may be disposed where a line crossing the conductive via 153 perpendicularly with respect to a length direction of the second metal wiring 155 passes.

Figure 5:
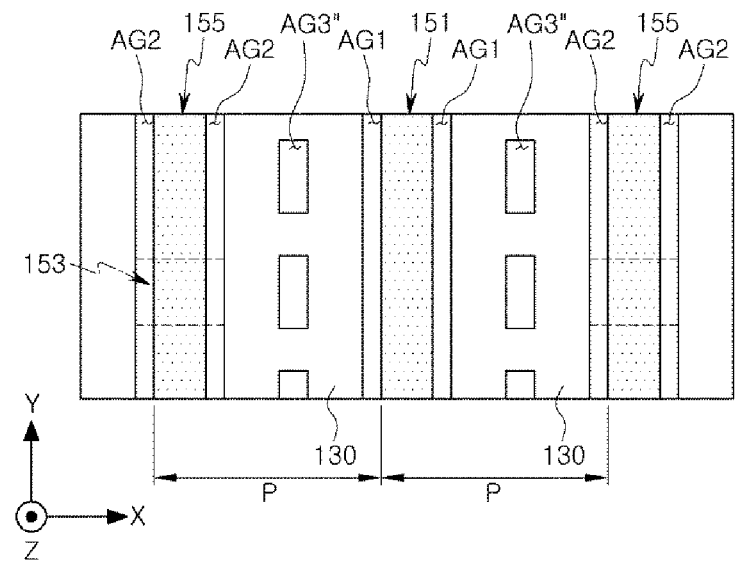
FIG. 5 is a plan view illustrating a semiconductor device according to an example embodiment.

FIG. 5 is a plan view illustrating a semiconductor device according to an example embodiment.

Referring to FIG. 5, in a manner different from the example embodiment illustrated in FIG. 1, in an example embodiment, a third air gap AG" may not continuously extend in the second direction (Y direction), in which the first metal wiring 151 and the second metal wiring 155 extend. The semiconductor device according to an example embodiment may include a plurality of third air gaps AG3", extending to a length shorter than that of the first air gap AG1 and the second air gap AG2, and disposed in a line in the second direction (Y direction).

Figure 6:
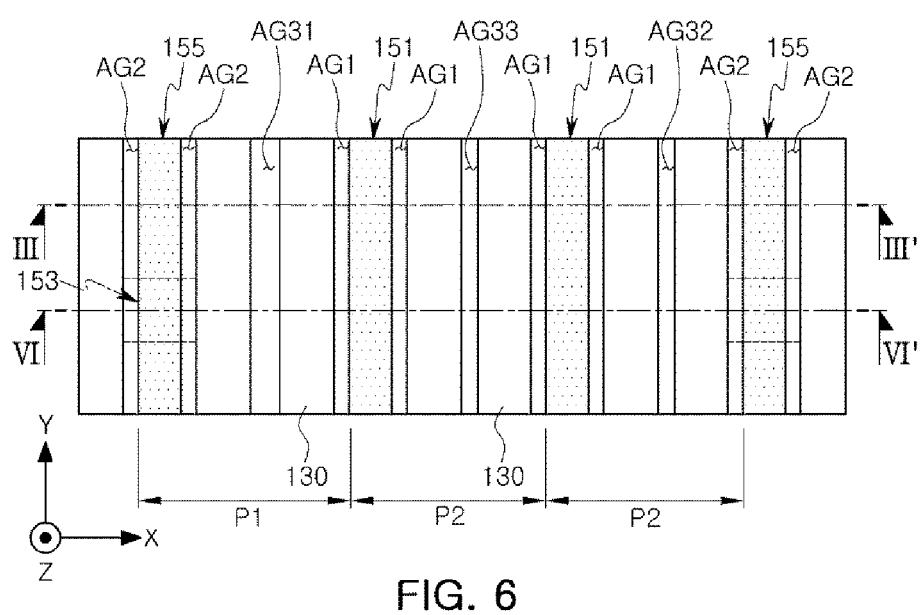
FIG. 6 is a plan view illustrating a semiconductor device according to an example embodiment.
Figure 7A:
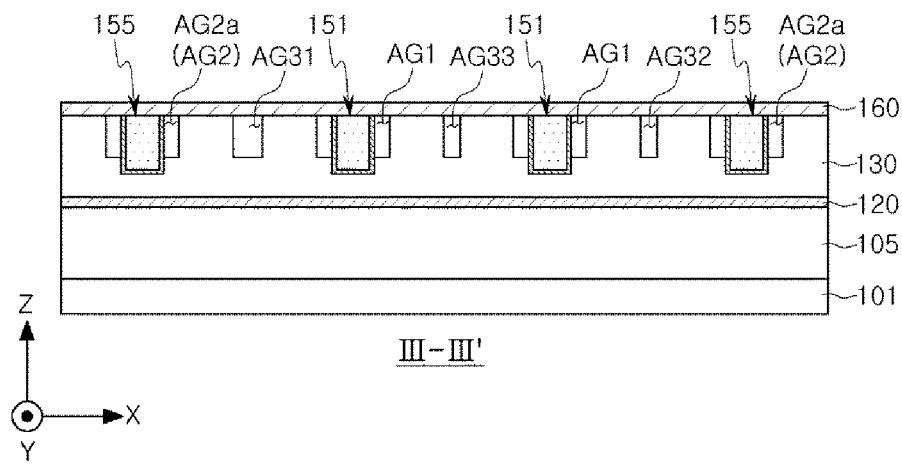
FIGS. 7A and 7B are cross-sectional views respectively taken along lines and IV-IV' of the semiconductor device illustrated in FIG. 6.
Figure 7B:
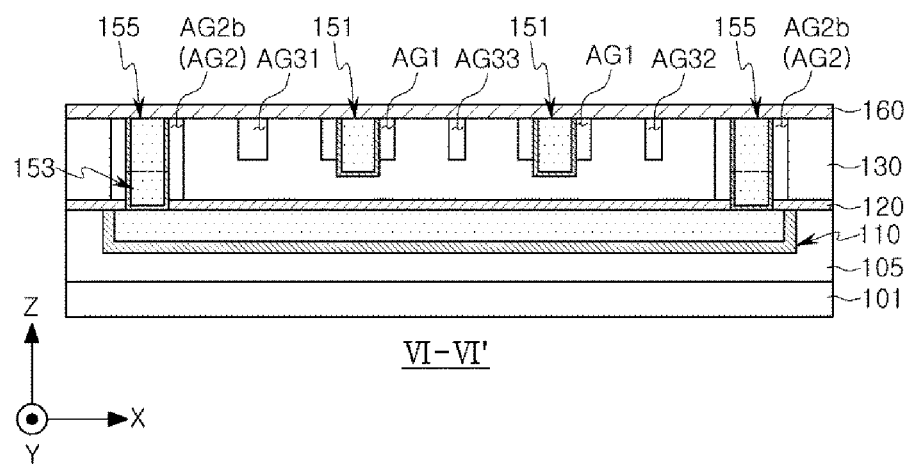

FIG. 6 is a plan view illustrating a semiconductor device according to an example embodiment. FIG. 7A is a cross-sectional view of a semiconductor device according to an example embodiment, and is a cross section taken along line III-III' of FIG. 6. FIG. 7B is a cross-sectional view of a semiconductor device according to an example embodiment, and is a cross section taken along line IV-IV' of FIG. 6. Hereinafter, a description overlapping with the description of FIGS. 1, 2A, and 2B will be omitted.

Referring to FIGS. 6, 7A, and 7B, the semiconductor device may include a substrate 101, a first interlayer insulating layer 105, a lower wiring 110, an etch stop layer 120, a second interlayer insulating layer 130, first metal wirings 151, second metal wirings 155, conductive vias 153, first air gaps AG1, second air gaps AG2, third air gaps AG31, AG32, AG33, and a capping layer 160. The second metal wiring 155 and the conductive via 153 may form a dual damascene structure.

A portion of metal wirings 151 and 155 may be formed at a first pitch P1, and a remaining portion of metal wirings 151 and 155 may be formed at a second pitch P2. The first pitch P1 may be wider than the second pitch P2.

A width of the third air gap AG31, located between metal wirings 151 and 155 disposed at the first pitch P1, may be greater than widths of third air gaps AG32 and AG33, located between metal wirings 151 and 155 disposed at the second pitch P2. For example, the width of the third air gap AG31 disposed between metal wirings 151 and 155 having the first pitch P1 may be greater than the width of the third air gap AG32 or AG33 disposed between metal wirings 151 and 155 having the second pitch P2 which is shorter than the first pitch P1.

The width of the third air gap AG32 may be equal to the width of the third air gap AG33.

The heights of the third air gaps AG31, AG32, and AG33 may be equal to the height of the first air gaps AG1.

Figure 8A:
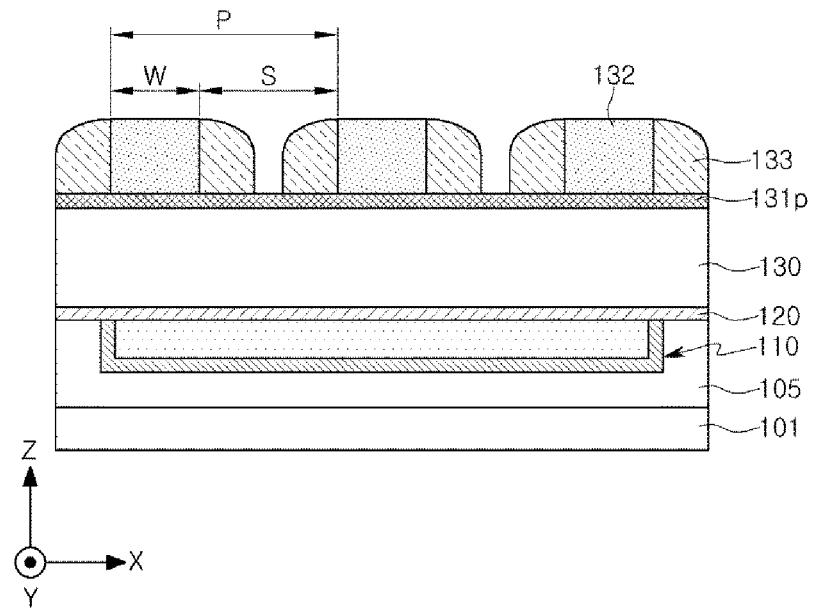
FIGS. 8A to 8L are cross-sectional views illustrating a method for manufacturing a semiconductor device according to an example embodiment.
Figure 8B:
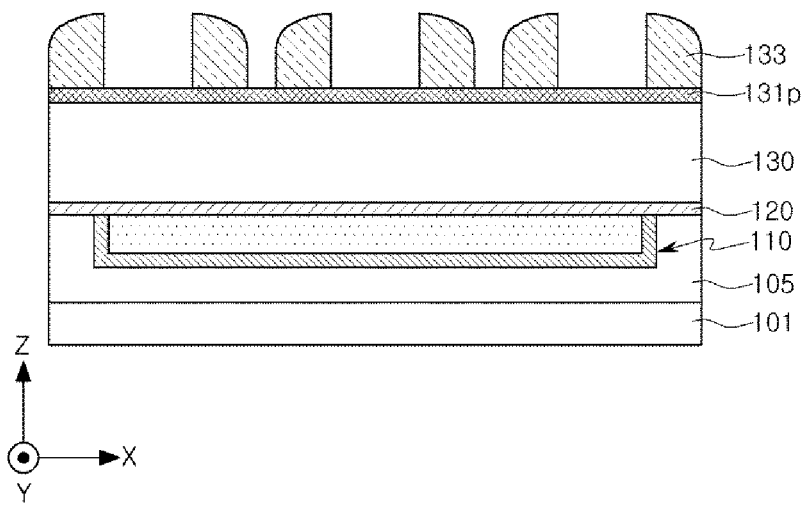
Figure 8C:
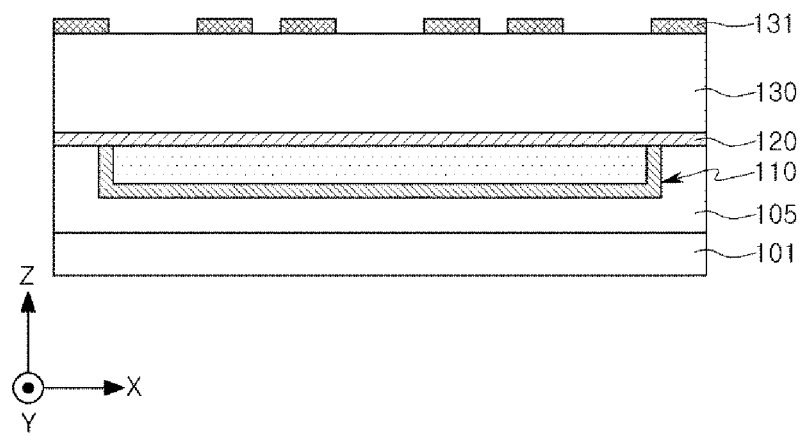
Figure 8D:
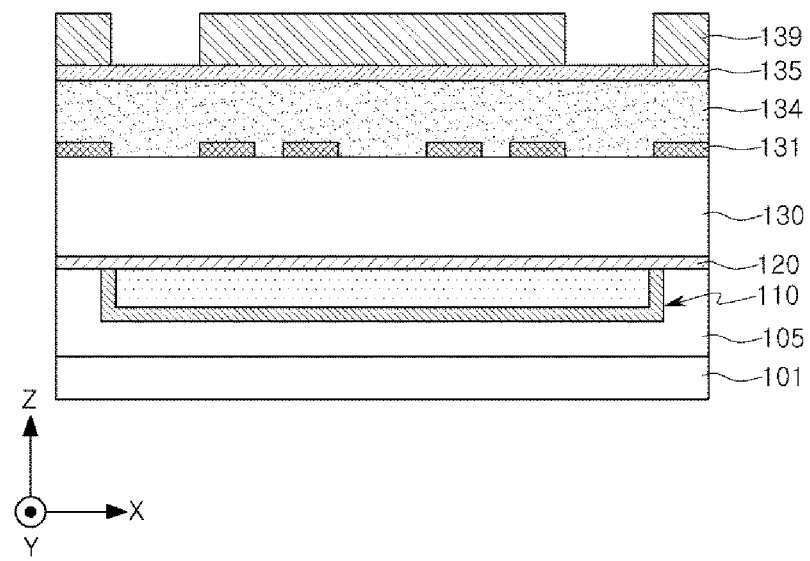
Figure 8E:
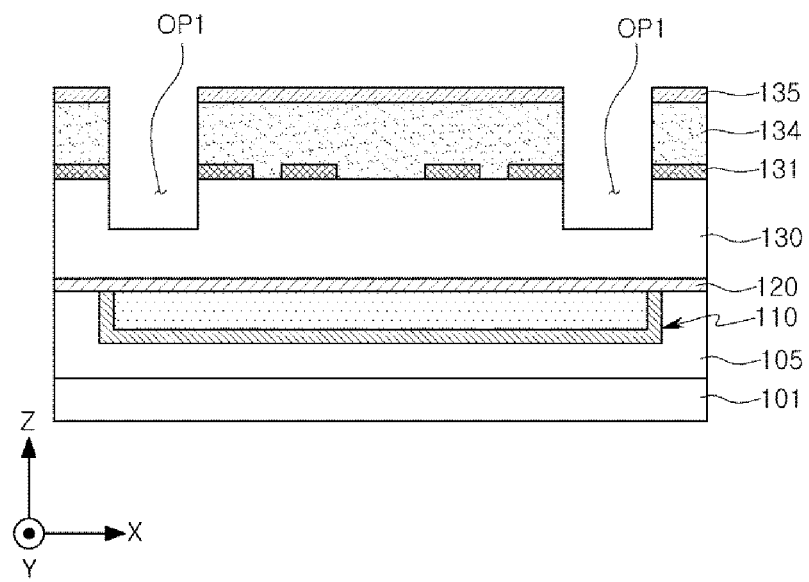
Figure 8F:
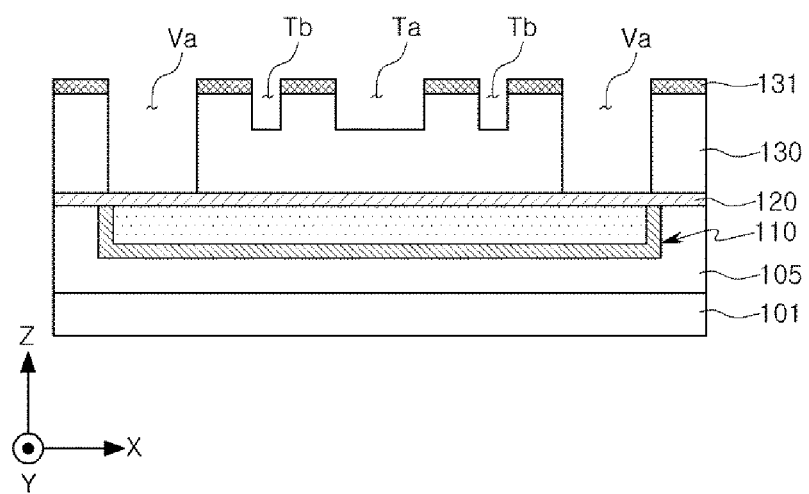
Figure 8G:
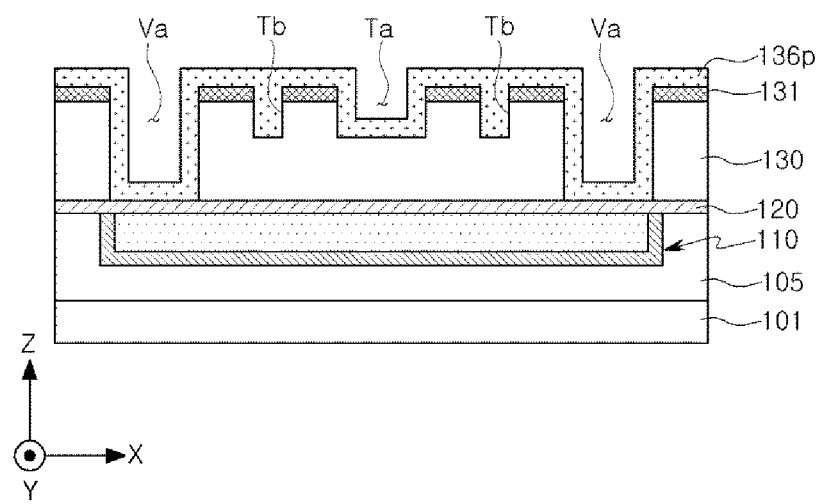
Figure 8H:
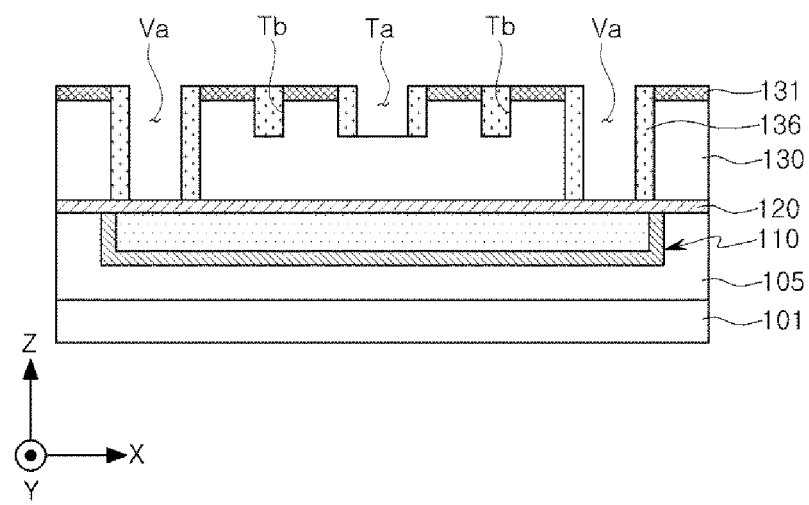
Figure 8I:
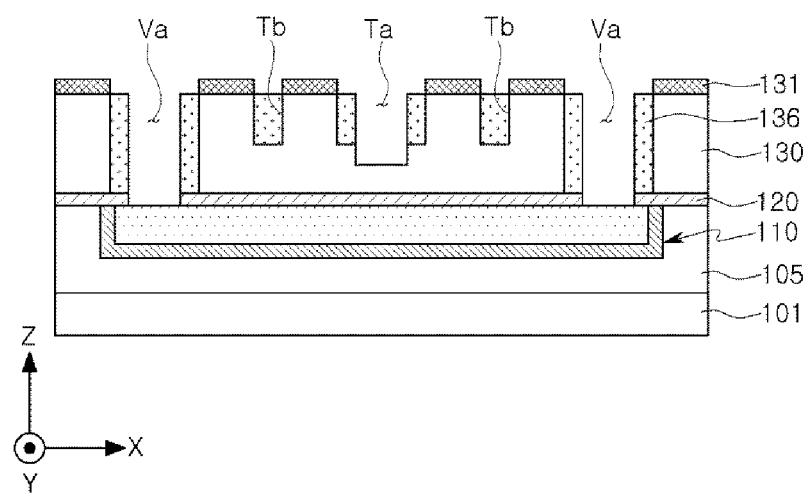
Figure 8J:
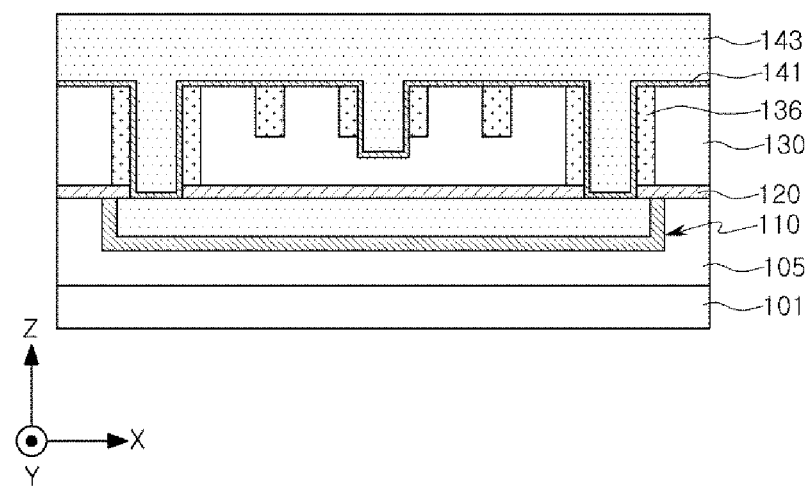
Figure 8K:
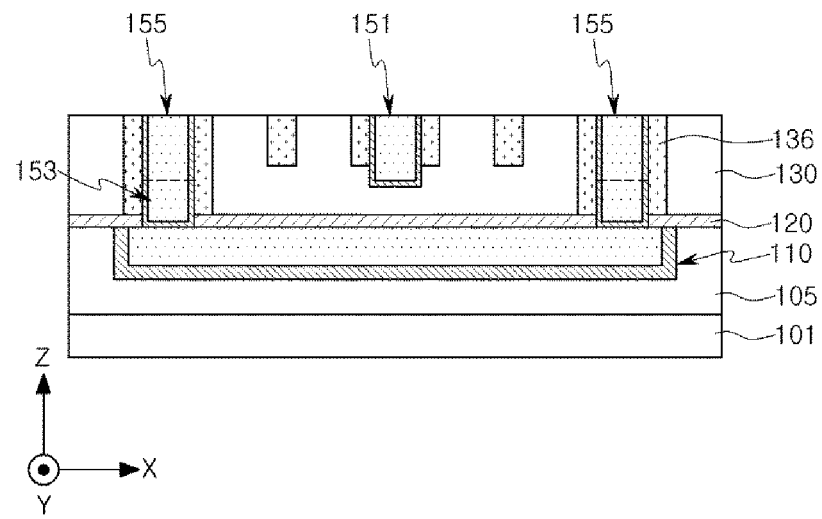
Figure 8L:
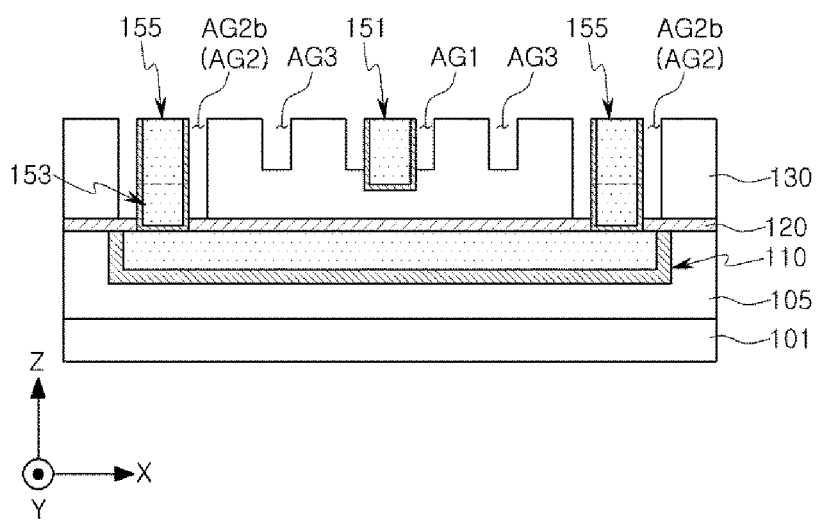

FIGS. 8A to 8L are cross-sectional views illustrating a method for manufacturing a semiconductor device according to an example embodiment. Referring to FIGS. 8A and 8L, a method for manufacturing a semiconductor device of FIGS. 1 to 2B will be described.

Referring to FIG. 8A, after a first interlayer insulating layer 105 is formed on a substrate 101, a lower wiring 110 may be formed in the first interlayer insulating layer 105. Next, an etch stop layer 120, a second interlayer insulating layer 130, and a hard mask layer 131p may be sequentially formed on the lower wiring 110 and the first interlayer insulating layer 105.

Before the first interlayer insulating layer 105 is formed, transistors may be formed on the substrate 101.

The first interlayer insulating layer 105 and the second interlayer insulating layer 130 may be formed of a silicon oxide film or a low dielectric insulating material having a dielectric constant lower than that of the silicon oxide film. For example, the first interlayer insulating layer 105 and the second interlayer insulating layer 130 may be silicon oxide layers or low dielectric layers. The etch stop layer 120 may include a silicon-containing material, for example, SiN, SiON, SiC, SiCN, or the like. The etch stop layer 120 may include a metal-containing material such as a metal nitride, a metal oxide, or the like. The hard mask layer 131p may include a metal nitride, for example, TiN, or the like.

Mandrel patterns 132, extending in the second direction (Y direction), may be formed on the hard mask layer 131p, while spacers 133 may be formed on sidewalls of the mandrel patterns 132. The mandrel patterns 132 may be formed with a constant width W and a constant interval S. For example, the mandrel patterns 132 may be formed at a constant pitch P. The mandrel patterns 132 may define a position at which metal wirings are to be formed subsequently.

Referring to FIG. 8B, the mandrel patterns 132 are selectively removed and spacers 133 may be provided as an independent pattern.

Referring to FIG. 8C, the hard mask layer 131p is patterned using the spacers 133 as an etching mask to form the hard mask pattern 131. The hard mask pattern 131 may include open areas having a line shape, extending in the second direction (Y direction).

FIGS. 8A to 8C illustrate a method for patterning the hard mask pattern 131 using self-aligned double patterning technology. Alternatively, the hard mask pattern 131 may be patterned using a multi-pattering technology, such as self-aligned quadruple patterning technology, litho-etch-litho-etch (LELE), or the like. For example, the hard mask pattern 131 may be patterned using a photolithography process using extreme ultraviolet (EUV) light.

Referring to FIG. 8D, a planarization layer 134 and an anti-reflective layer 135 are formed on a hard mask pattern 131, and a photoresist pattern 139 may be formed on the anti-reflective layer 135. The photoresist pattern 139 may include open areas, in positions corresponding to a position in which a conductive via is formed. For example, the photoresist pattern 139 may be formed by depositing a photoresist layer on the anti-reflective layer 135, exposing the photoresist layer to a light using a photomask, and developing the exposed photoresist layer to form the photoresist pattern 139 having the open areas. The planarization layer 134 may include, for example, a carbon-based spin on hardmask (SOH), a silicon-based spin on hardmask (SOH), or a combination thereof. The anti-reflective layer 135 may include, for example, silicon oxynitride.

Referring to FIG. 8E, the anti-reflective layer 135 and the planarization layer 134 are etched, and the second interlayer insulating layer 130 may be partially etched. Thus, an opening OP1 may be formed in the second interlayer insulating layer 130.

Referring to FIG. 8F, a first trench Ta, dummy trenches Tb, and second trenches Va may be provided. The second trenches Va are dual damascene trenches. For example, the second trenches Va may have two or more different depths in a perpendicular direction to the substrate 101. For example, bottom surfaces of the second trenches may be at different levels with respect to a perpendicular direction to the substrate 101 in a cross-sectional view.

The planarization layer 134 and the anti-reflective layer 135, remaining, may be removed first. Next, the second interlayer insulating layer 130 may be additionally etched using the hard mask pattern 131 as an etching mask. The first trench Ta and the dummy trenches Tb may be formed in the second interlayer insulating layer 130, and a portion (a via hole region) of the second trenches Va may pass through the second interlayer insulating layer 130 to allow the etch stop layer 120 to be exposed.

Referring to FIG. 8G, a sacrificial spacer material layer 136p may be conformally formed on the substrate 101. The sacrificial spacer material layer 136p may include a silicon-based material, such as amorphous silicon, SiO, SiN, SiC, or the like, or a metal such as Al, Ti, or the like, and an oxide or a nitride of these metals. The dummy trench Tb may be filled with a sacrificial spacer material layer 136p.

Referring to FIG. 8H, sacrificial spacers 136 may be formed on sidewalls of the first trench Ta, the dummy trench Tb, and the second trench Va. The dummy trench Tb may be filled with a sacrificial spacer 136.

Referring to FIG. 8I, the etch stop layer 120, exposed by the via hole region of the second trench Va, may be removed. Thus, a portion of the lower wiring 110 may be exposed. In this process, a bottom of the first trench Ta, in which the sacrificial spacers 136 are not disposed, may be additionally etched. For example, portions of the first trench Ta exposed by the sacrificial spacers 136 may be etched in the process of etching the stop layer 120.

Referring to FIG. 8J, the hard mask pattern 131 is removed, and then a barrier layer 141 and a conductive layer 143 may be provided. The conductive layer 143 may include, for example, copper (Cu). The conductive layer 143 may be formed using a plating process.

Referring to FIG. 8K, metal wirings 151 and 155, spaced apart from each other in the second interlayer insulating layer 130, may be formed using a chemical mechanical polishing (CMP) process. In addition, the conductive via 153 may be provided therewith. For example, an upper portion of the conductive layer 143 and an upper portion of the barrier layer 141 may be removed by the CMP process. In certain embodiments, an upper portion of the sacrificial spacers 136 and an upper portion of the second interlayer insulating layer 130 may also be removed by the CMP process.

Referring to FIG. 8L, the sacrificial spacers 136 are selectively removed to form air gaps AG1, AG2, and AG3.

Referring to FIG. 2B, a capping layer 160, covering the air gaps AG1, AG2, and AG3, may be provided non-conformally. For example, the capping layer 160 may be formed on the second interlayer insulating layer 130, on the metal wirings 151 and 155, and on the barrier layer 141. The capping layer 160 may not contact bottom surfaces of the air gaps AG1, AG2 and AG3.

According to an example embodiment, the first air gap AG1, the second air gap AG2, and the third air gap AG3 may be provided to be self-aligned between metal wirings 151 and 155. For example, the air gaps AG1, AG2 and AG3 may be formed by using a self-aligned double patterning process, a self-aligned quadruple patterning process or another self-aligned spacer-using method as described in previous embodiments. The resulting air gaps AG1, AG2 and AG3 may be self-aligned with the metal wirings 151 and 155. For example, the first air gap AG1 contacts the first wiring 151, the second air gap AG2 contacts the second wiring 155, and the third air gap AG3 is spaced apart from the first and second wirings 151 and 155 with the same distance in a cross-sectional view.

Figure 9A:
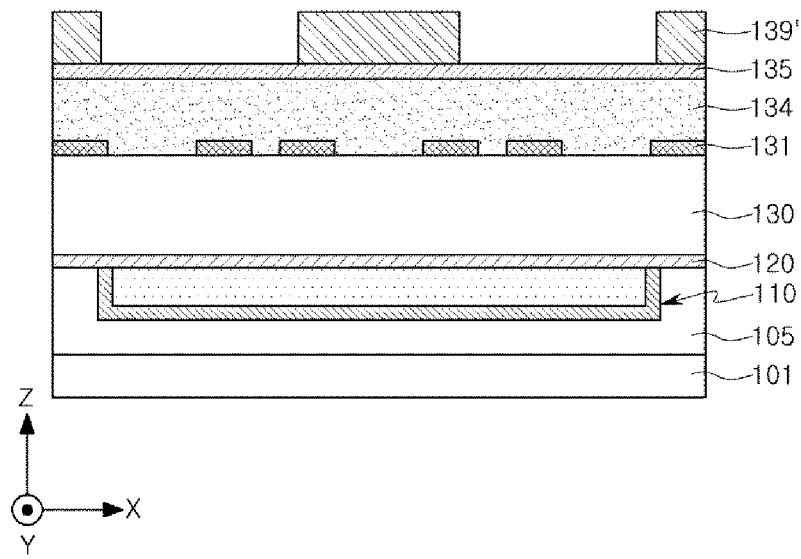
FIGS. 9A to 9F are cross-sectional views illustrating a method for manufacturing a semiconductor device according to an example embodiment.
Figure 9B:
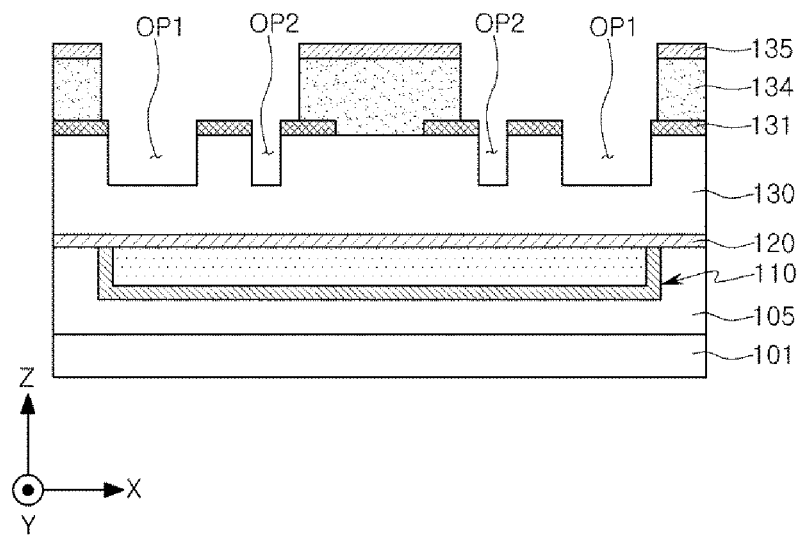
Figure 9C:
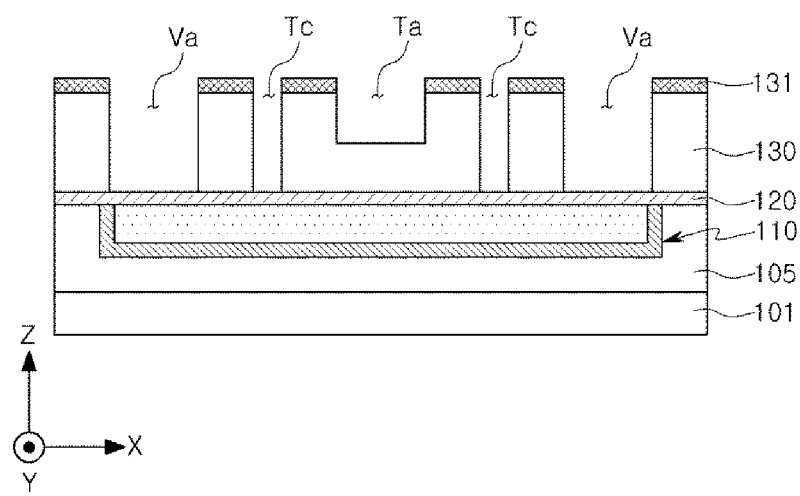
Figure 9D:
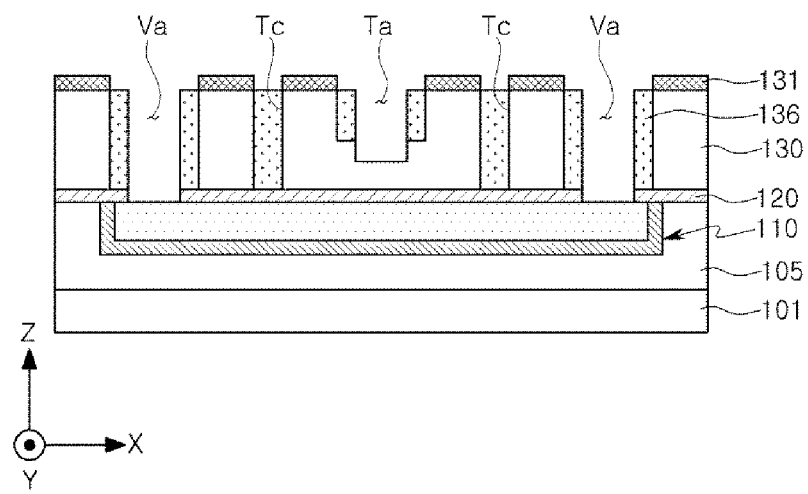
Figure 9E:
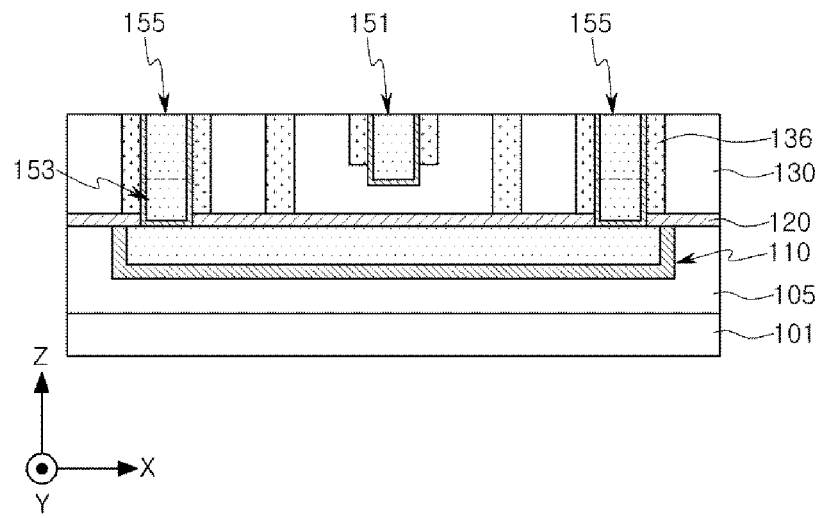
Figure 9F:
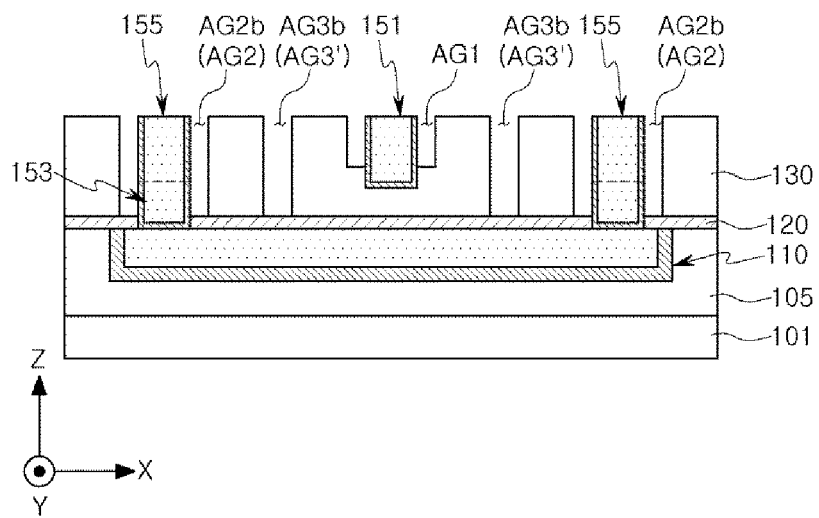

FIGS. 9A to 9F are cross-sectional views illustrating a method for manufacturing a semiconductor device according to an example embodiment. Referring to FIGS. 9A and 9F, a method for manufacturing a semiconductor device of FIGS. 3 to 4B will be described.

First, similar processes to or the same processes as the ones described with respect to FIGS. 8A to 8C may be performed.

Then, referring to FIG. 9A, a planarization layer 134 and an anti-reflective layer 135 are formed on a hard mask pattern 131, and a photoresist pattern 139' may be formed on the anti-reflective layer 135. The photoresist pattern 139' may include open areas, in a position, corresponding to a position in which a conductive via is formed. The open areas may be formed wider as compared to FIG. 8D. For example, one open area in the photoresist pattern 139' may overlap with regions where three separate air gaps are to be formed, e.g., two air gaps on both sidewalls of the conductive via and another air gap being spaced apart from the conductive via. The photoresist pattern 139' may be formed with the same process as or a similar process to the processes forming the photoresist patterns in the previous embodiments.

Referring to FIG. 9B, the anti-reflective layer 135 and the planarization layer 134 are etched, and the second interlayer insulating layer 130 may be partially etched. Openings including a first opening OP1 and a second opening OP2 may be formed in the second interlayer insulating layer 130. Each of the first opening OP1 and the second opening OP2 may have a line shape, extending in the second direction (Y direction). The width of the second opening OP2 may be smaller than the width of the first opening OP1.

Referring to FIG. 9C, a first trench Ta, dummy trenches Tc, and second trenches Va may be provided. The second trenches Va may be dual damascene trenches. For example, bottom surfaces of the second trenches may be at different levels with respect to a perpendicular direction to the substrate 101 in a cross-sectional view. The dummy trenches Tc may have a structure similar to that of the second trenches Va. For example, the depth of the dummy trenches Tc in a direction perpendicular to the substrate 101 may be the same as the depth of the second trenches Va. For example, the lowest surface of the dummy trenches Tc may be at the same level as the lowest surface of the second trenches Va. In certain embodiments, different portions of the bottom surfaces of the dummy trenches Tc may be at different levels with respect to a perpendicular direction to the substrate 101 in a cross-sectional view.

The planarization layer 134 and the anti-reflective layer 135, remaining, may be removed first. Next, the second interlayer insulating layer 130 may be additionally etched using the hard mask pattern 131 as an etching mask. The first trench Ta is formed in the second interlayer insulating layer 130, while a portion of the dummy trench Tc and a portion (a via hole region) of the second trench Va may pass through the second interlayer insulating layer 130 to allow the etch stop layer 120 to be exposed.

Referring to FIG. 9D, sacrificial spacers 136 may be formed on sidewalls of the first trench Ta, the dummy trench Tb, and the second trench Va. The dummy trench Tc may be filled with a sacrificial spacer 136. Next, the etch stop layer 120, exposed by the via hole region of the second trench Va, may be removed. In this process, a bottom of the first trench Ta, in which the sacrificial spacers 136 are not disposed, may be additionally etched.

Referring to FIG. 9E, metal wirings 151 and 155, spaced apart from each other in the second interlayer insulating layer 130, may be provided. In addition, the conductive via 153 may be provided therewith. For example, the conductive via 153 and the metal wirings 151 and 155 may be formed by the same process as or a similar process to the ones of the previous embodiments.

Referring to FIG. 9F, the sacrificial spacers 136 are selectively removed to form air gaps AG1, AG2, and AG3'.

Referring to FIG. 4B, a capping layer 160, covering the air gaps AG1, AG2, and AG3', may be provided non-conformally. For example, the capping layer 160 may be formed on the second interlayer insulating layer 130, on the metal wirings 151 and 155, and on the barrier layer 141. The capping layer 160 may not contact bottom surfaces of the air gaps AG1, AG2 and AG3.

According to an example embodiment, the first air gap AG1, the second air gap AG2, and the third air gap AG3', self-aligned between metal wirings 151 and 155, may be provided. For example, the air gaps AG1, AG2 and AG3' may be formed by using a self-aligned double patterning process, a self-aligned quadruple patterning process or another self-aligned spacer-using method as described in previous embodiments. The resulting air gaps AG1, AG2 and AG3 may be self-aligned with the metal wirings 151 and 155 as similarly described in the previous embodiments.

Figure 10:
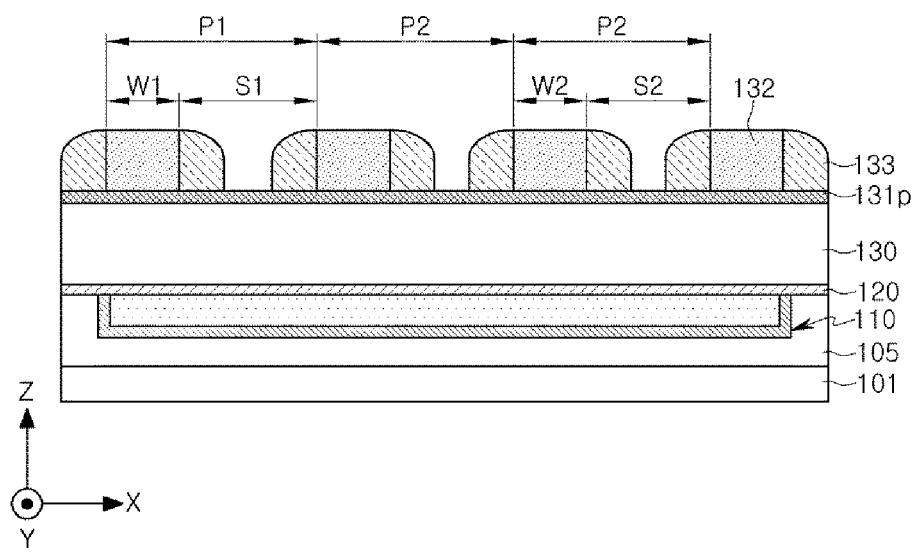
FIG. 10 is a cross-sectional view illustrating a method for manufacturing a semiconductor device according to an example embodiment.

FIG. 10 is a cross-sectional view illustrating a method for manufacturing a semiconductor device according to an example embodiment. Referring to FIG. 10, a method for manufacturing a semiconductor device of FIGS. 6 to 7B will be described.

Referring to FIG. 10, a first interlayer insulating layer 105, a lower wiring 110, an etch stop layer 120, a second interlayer insulating layer 130, and a hard mask layer 131p may be sequentially formed on a substrate 101. Before the first interlayer insulating layer 105 is formed, transistors may be formed on the substrate 101.

Mandrel patterns 132, extending in the second direction (Y direction), may be formed on the hard mask layer 131p, while spacers 133 may be formed on sidewalls of the mandrel patterns 132. A portion of the mandrel patterns 132 may be formed at a first width W1 and a first interval S1, while a remaining portion of the mandrel patterns 132 may be formed at a second width W2 and a second interval S2. For example, a portion of the mandrel patterns 132 may be formed at a first pitch P1, and a remaining portion of the mandrel patterns 132 may be formed at a second pitch P2. The first width W1 may be equal to the second width W2, while the first interval S1 may be wider than the second interval S2. The first pitch P1 may be greater than the second pitch P2. The mandrel patterns 132 may define a position at which metal wirings are to be formed subsequently. Therefore, a portion of metal wirings may be formed at a first pitch P1, and a remaining portion may be formed at a second pitch P2.

Next, similar processes to or the same processes as the ones described with respect to FIGS. 8B to 8L may be performed, and finally, the capping layer 160 of FIGS. 7A and 7B may be provided.

As set forth above, according to example embodiments of the present inventive concept, air gaps may be formed between metal wirings without damaging the metal wirings, and thus a semiconductor device with improved RC delay may be provided.

While some example embodiments have been shown and described above, it will be apparent to those skilled in the art that modifications and variations could be made without departing from the scope of the present inventive concept, as defined by the appended claims.

What is claimed is:

1. A semiconductor device, comprising:
an interlayer insulating layer disposed on a substrate;
a first metal wiring and a second metal wiring disposed in the interlayer insulating layer, the first and second metal wirings spaced apart from each other in a first direction, the first and second metal wirings extending in a second direction perpendicular to the first direction;
an air gap formed in the interlayer insulating layer between the first metal wiring and the second metal wiring, the air gap spaced apart from the first metal wiring with a portion of the interlayer insulating layer interposed between a sidewall of the air gap and a sidewall of the first metal wiring closest to each other, the air gap spaced apart from the second metal wiring with a portion of the interlayer insulating layer interposed between a sidewall of the air gap and a sidewall of the second metal wiring closest to each other;
a capping layer disposed on the interlayer insulating layer, the capping layer covering the first metal wiring, the second metal wiring, and the air gap;
a first sidewall air gap formed between the first metal wiring and the interlayer insulating layer, the sidewall of the first metal wiring comprises a boundary of the first sidewall air gap; and
a second sidewall air gap formed between the second metal wiring and the interlayer insulating layer, the sidewall of the second metal wiring comprises a boundary of the second sidewall air gap,
wherein the air gap is disposed between the first sidewall air gap and the second sidewall air gap,
wherein the air gap is disposed at a first distance from the first metal wiring in the first direction and at a second distance from the second metal wiring in the first direction, and
wherein the first and second distances are the same.

2. The semiconductor device of claim 1, wherein a distance from a lower surface of the capping layer to a bottom of the air gap in a third direction perpendicular to the first and second directions is smaller than a distance from the lower surface of the capping layer to a bottom of the first metal wiring in the third direction.

3. The semiconductor device of claim 1, wherein a width of the second sidewall air gap in the first direction is equal to a width of the first sidewall air gap in the first direction, and
a width of the air gap in the first direction is different from the width of the first sidewall air gap in the first direction.

4. The semiconductor device of claim 1, wherein a height of the air gap in a third direction perpendicular to the first and second directions is equal to a height of the first sidewall air gap in the third direction.

5. The semiconductor device of claim 1, wherein the second sidewall air gap includes portions having different heights in a third direction perpendicular to the first and second directions.

6. The semiconductor device of claim 1, further comprising a conductive via extending from the second metal wiring toward the substrate, and passing through the interlayer insulating layer,
wherein the second metal wiring and the conductive via have a dual damascene structure.

7. The semiconductor device of claim 6, wherein the second sidewall air gap includes a first portion having a height, in a third direction perpendicular to the first and second directions, equal to a height of the first sidewall air gap in the third direction and a second portion disposed on a sidewall of the conductive via and having a height greater than the height of the first sidewall air gap in the third direction.

8. The semiconductor device of claim 7, wherein a height of the air gap is equal to a height of the second portion of the second sidewall air gap.

9. The semiconductor device of claim 1, wherein a length of the air gap in the second direction is shorter than a length of the first sidewall air gap in the second direction.

10. A semiconductor device, comprising:

an interlayer insulating layer disposed on a substrate;

a first metal wiring and a second metal wiring disposed in the interlayer insulating layer, the first and second metal wirings spaced from each other in a first direction, the first and second metal wirings extending in a second direction perpendicular to the first direction;

a first air gap formed on a sidewall of the first metal wiring, the first air gap extending in the second direction;

a second air gap formed on a sidewall of the second metal wiring, the second air gap extending in the second direction;

a third air gap formed between the first air gap and the second air gap, the third air gap extending in the second direction; and a capping layer covering the first air gap, the second air gap, and the third air gap, wherein the first and second metal wirings do not have any other wirings between them in the first direction, wherein portions of the interlayer insulating layer are interposed between the third air gap and the respective first and second air gaps, wherein a width of the second air gap in the first direction is equal to a width of the first air gap in the first direction, and a width of the third air gap in the first direction is different from the width of the first air gap in the first direction.

11. The semiconductor device of claim 10, wherein a distance in a third direction from a lower surface of the capping layer to a bottom of the third air gap is smaller than a distance in the third direction from the lower surface of the capping layer to a bottom of the first metal wiring, and wherein the third direction is perpendicular to the first and second directions.

12. The semiconductor device of claim 10, wherein a height of the third air gap in a third direction perpendicular to the first and second directions is equal to a height of the first air gap in the third direction.

13. The semiconductor device of claim 10, further comprising a conductive via extending from the second metal wiring toward the substrate in a third direction perpendicular to the first and second directions, and passing through the interlayer insulating layer, wherein the second metal wiring and the conductive via have a dual damascene structure.

14. The semiconductor device of claim 13, wherein the second air gap includes a first portion having a height in the third direction equal to a height of the first air gap in the third direction and a second portion disposed on a sidewall of the conductive via and having a height in the third direction greater than the height of the first air gap in the third direction.

15. The semiconductor device of claim 14, wherein a height of the third air gap in the third direction is equal to the height of the second portion of the second air gap in the third direction.

* * * * *